(12) United States Patent
Shimizu et al.

(10) Patent No.: US 7,351,354 B2
(45) Date of Patent: Apr. 1, 2008

(54) TUNGSTEN METAL REMOVING SOLUTION AND METHOD FOR REMOVING TUNGSTEN METAL BY USE THEREOF

(75) Inventors: Toshikazu Shimizu, Saitama (JP); Kaori Watanabe, Kanagawa (JP); Hidemitsu Aoki, Kanagawa (JP)

(73) Assignee: Kanto Kagaku Kabushiki Kaisha, Kawasaki, Kanagawa (JP)

( * ) Notice: Subject to any disclaimer, the term of this patent is extended or adjusted under 35 U.S.C. 154(b) by 39 days.

(21) Appl. No.: 11/001,684

(22) Filed: Dec. 1, 2004

(65) Prior Publication Data
US 2005/0156140 A1    Jul. 21, 2005

(30) Foreign Application Priority Data
Dec. 2, 2003    (JP) .............................. 2003-403240

(51) Int. Cl.
*H01L 21/302*    (2006.01)
(52) U.S. Cl. .................. 252/79.3; 252/79.1; 252/79.2; 438/692; 438/693; 438/704
(58) Field of Classification Search ................. 252/79.1
See application file for complete search history.

(56) References Cited

U.S. PATENT DOCUMENTS

| | | | |
|---|---|---|---|
| 6,849,099 B2 * | 2/2005 | Ohno et al. | 51/308 |
| 2001/0006246 A1 * | 7/2001 | Kwag et al. | 257/522 |
| 2003/0017419 A1 | 1/2003 | Futase et al. | |
| 2003/0207214 A1 | 11/2003 | Futase et al. | |

OTHER PUBLICATIONS

Of Luo et al. (IEEE Transactions on Semiconductor Maunufacturing, vol. 16, No. 1, Feb. 2003).*

* cited by examiner

*Primary Examiner*—Nadine Norton
*Assistant Examiner*—Patricia A. George
(74) *Attorney, Agent, or Firm*—Lowrie, Lando & Anastasi, LLP

(57) ABSTRACT

A removing solution for removing tungsten metal which causes a film formation on a semiconductor substrate or adheres to it, wherein orthoperiodic acid and water are contained.

4 Claims, 1 Drawing Sheet

TUNGSTEN METAL REMOVING SOLUTION AND METHOD FOR REMOVING TUNGSTEN METAL BY USE THEREOF

RELATED APPLICATIONS

Foreign priority benefits are claimed under 35 U.S.C. §119(a)-(d) or 35 U.S.C. §365(b) of Japanese patent application number 2003-403240, filed Dec. 2, 2003, which is incorporated herein by reference in its entirety.

BACKGROUND OF INVENTION

1. Field of the Invention

The invention relates to a tungsten metal removing solution which is effective for removing unnecessary tungsten metal causing a film formation on a semiconductor substrate, etc., or adhering to them, more particularly, relates to a tungsten metal removing solution, which has little causticity toward silicon in the substrate back side and titanium nitride or silicon oxide of the liner, and a method for removing tungsten metal using by use thereof.

2. Description of Related Art

An example is reported in which tungsten silicide or almost tungsten metal which is made by heat treatment of tungsten silicide is used as a gate electrode material (for example, JP A 62-143422), and use of titanium tungsten or titanium aluminum alloys as a wiring material for semiconductors is reported (for example, JP A 8-250462). In addition, tungsten metal has been used as a metal for filling contact holes or via holes according to a multiplelayer trend in a semiconductor substrate, and further, a case is reported in which after filling contact holes or via holes with tungsten metal, tungsten metal causing a film formation on a substrate front side is processed and used as wiring.

In recent years, tungsten metal has been used as an electrode material in DRAM, FeRAM, System LSI, etc. Although there are methods such as sputtering or CVD as a method to cause a film formation of tungsten metal, in any method whatever, tungsten metal causes the film formation on the total surface of a substrate including its periphery. Tungsten metal, which causes a film formation on a periphery and back side of the substrate except a device forming area or adheres to them, is spontaneously separable easily, and it is considered that the separated tungsten metal adheres to the device forming area and induces a cross contamination of a film forming apparatus through a conveyor system, therefore, before moving to the next step, the complete removing of tungsten metal, which causes a film formation on the periphery and back side of the substrate except a device forming area or adheres to them, is examined. Here, "areas except a device forming area" means areas including not only the facet and back side of a semiconductor substrate, but the periphery of a device forming surface.

Although there is so far no report of a removing solution for removing tungsten metal which causes a film formation on a periphery or back side of the substrate except a device forming area or adheres to them, an etching fluid for tungsten metal or tungsten alloy has been reported.

For example, although mix fluids (JP A 8-250462, JP A 11-219946, JP A 2000-311891) of ammonia and water with hydrogen peroxide or hydrogen peroxide water are proposed as etching fluids for tungsten metal, there are problems that hydrogen peroxide water easily decomposes generating oxygen and the life time as the etching fluid is short. Further, it can not necessarily be said that these etching fluids are practical etching fluids due to production of granular or membranous residues after etching, and the like. Therefore, these are not appropriate as the removing solution for tungsten metal.

In addition, in the production of semiconductor or devices, a silicon oxide insulating film and a tungsten metal film make a stacked state on the facet or back side of a silicon substrate, though a step to remove the tungsten metal film and a step to remove silicon oxide are carried out in the same apparatus, and the removing of silicon oxide film is carried out using usually an acidic reagent fluid such as hydrofluoric acid. Therefore, when the removing of tungsten metal film is carried out using a basic reagent fluid such as ammonia, there is a problem that a salt such as ammonium fluoride is deposited in an etching room or an exhaust duct.

Although an aqueous solution containing hydrofluoric acid and nitric acid may be considered as an acidic tungsten removing solution to prevent deposition of salts, this aqueous solution corrodes silicon as well as silicon oxide, and therefore, it is reported that it is not appropriate in a device production (JP A 8-250462).

On the other hand, although a targeted metal for removing is different, a composition containing orthoperiodic acid and nitric acid is reported as an acidic removing solution to remove ruthenium metal which causes a film formation on the periphery of a semiconductor substrate and adheres to it (JP A 2001-68463). However, the removing of tungsten metal is not disclosed in any way.

In addition, although a removing solution composition containing orthoperiodic acid, hydrofluoric acid and sulfuric acid is reported (U.S. Pat. No. 6,461,978), a removing solution composition which does not contain sulfuric acid as an essential component is silent in this document.

SUMMARY OF INVENTION

In accordance with one or more embodiments, the invention is directed to a tungsten removing solution comprising orthoperiodic acid, hydrofluoric acid and water. The removing solution typically does not comprise sulfuric acid.

In accordance with one or more embodiments, the invention is directed to a method of removing tungsten film with a removing solution comprising orthoperiodic acid, hydrofluoric acid, and water. The removing solution typically does not comprise sulfuric acid. The method can comprise rotating a semiconductor substrate on which tungsten film is formed and jetting the removing solution.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
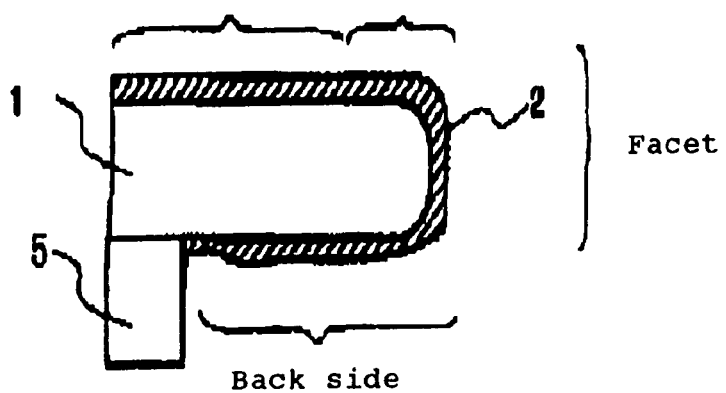
FIG. 1 is a schematic diagram showing the external appearance of a silicon substrate after tungsten film formation.

In accordance with one or more embodiments, the invention provides a stable and acidic removing solution for removing tungsten metal, which causes a film formation on a semiconductor substrate or adheres to it, and a method for removing tungsten metal by use thereof.

In accordance with one or more embodiments, the invention is directed to a removing solution comprising orthoperiodic acid ($H_5IO_6$) and water and which can sufficiently dissolve and remove tungsten metal.

Namely, the invention relates to a removing solution for removing tungsten metal which causes a film formation on a semiconductor substrate or adheres to it, wherein orthoperiodic acid, hydrofluoric acid and water are typically contained, and sulfuric acid is typically not contained.

In some cases, the invention relates to the above removing solution, wherein the content of orthoperiodic acid is 5 to 50% by mass and the content of hydrofluoric acid is 0.01 to 5% by mass.

Further, the invention relates to the above removing solution, wherein the tungsten metal is tungsten metal which causes a film formation on an area except a device forming area of the semiconductor substrate or adheres to it.

In addition, the invention relates to a method for removing tungsten metal, which causes a film formation on an area except a device forming area of the semiconductor substrate or adheres to it, by rotating said semiconductor substrate keeping horizontally on which film is formed with tungsten metal and by jetting the above removing solution to an area except the device forming area of said semiconductor substrate.

As to a removing solution of the invention, in case of using one known as a removing solution of ruthenium metal described in JP A 2001-68463, which makes nitric acid an essential ingredient, the etching grade of tungsten metal is reduced and a sufficient dissolution and removing effect can not be obtained. While such a removing solution can improve the etching grade of ruthenium metal adhering on a semiconductor substrate, the etching grade of tungsten metal of the same transition metal is reduced, though it is surprising to find out a remarkable removing effect for tungsten metal by hydrofluoric acid in the invention.

The removing solution of the invention has little causticity toward silicon, and titanium nitride or silicon oxide of the liner, and can sufficiently dissolve and remove unnecessary tungsten metal. In particular, it is appropriate for removing unnecessary tungsten metal, which causes a film formation on the periphery or back side of a semiconductor substrate or adheres to them. Using the tungsten metal removing solution of the invention, unnecessary tungsten metal can be removed, and it can contribute to improvement in the yield of a semiconductor production.

Although the removing solution of the invention can remove tungsten metal in a sufficient dissolution rate even in the case consisting of orthoperiodic acid and water, tungsten metal removing power can greatly be improved by further addition of hydrofluoric acid. Furthermore, the removing solution of the invention suppresses dissolution toward silicon, and silicon oxide or titanium nitride of the liner, and can selectively remove tungsten only.

In addition, since the removing solution of the invention is excellent in the stability, it can be stored for a long period of time. Further, the removing solution of the invention is a very practical etching fluid because it does not produce granular or membranous residues after etching and can efficiently be used together with another acidic fluid in the same apparatus.

One or more embodiments of the invention is described in the following.

As similar compounds to orthoperiodic acid being a component of the removing solution of the invention, illustrative are perchloric acid, persulfuric acid, bromic acid, hydrogen peroxide water and the like, though perchloric acid and persulfuric acid may not give a sufficient dissolution and removing effect for tungsten metal. In addition, bromic acid is typically not stable, and hydrogen peroxide water can decompose spontaneously as described above, therefore, its use may be limited. Compared with these, orthoperiodic acid sufficiently dissolves and removes tungsten metal, and is preferable because it does not contain an alkaline metal and unfavorable effect toward devices is small.

As similar inorganic acids to hydrofluoric acid being the component of the removing solution of the invention, illustrative are, for example, nitric acid, hydrochloric acid, acetic acid, phosphoric acid and the like, which are typically used in an etching fluid of aluminum or an aluminum alloy, though comparing with orthoperiodic acid alone, even the addition of phosphoric acid, nitric acid or acetic acid to orthoperiodic acid typically shows little or no synergistic effect, and a sufficient dissolution and removing effect for tungsten metal may not be obtained. Hydrochloric acid can generate gas in case of mixing with orthoperiodic acid and is not preferred. Comparing with orthoperiodic acid alone, the addition of hydrofluoric acid reveals a remarkable removing effect for tungsten metal by synergistic effect, and therefore, it is preferable.

In the invention, the dissolution rate of tungsten metal is not particularly limited, however, it is typically not less than 30 nm/min, preferably not less than 100 nm/min, more preferably not less than 200 nm/min from a viewpoint of the treatment time as a tungsten metal removing solution.

In the invention, although the content of orthoperiodic acid is not particularly limited if it is a degree to be able to sufficiently dissolve and remove tungsten metal, it is preferable to suppress the amount to a degree to be able to effectively inhibit deposition of orthoperiodic acid, therefore, it is typically 5-50% by mass, preferably 15-30% by mass.

In the invention, although the content of hydrofluoric acid is not particularly limited if it is a degree to be able to sufficiently dissolve and remove tungsten metal, it is preferable to suppress the amount to a degree to be able to effectively inhibit corrosion of the back side silicon, the base titanium nitride and silicon oxide, therefore, it is typically 0-5% by mass, preferably 0.01-5% by mass. more preferably 0.1-1% by mass.

The removing solution of the invention is the constitution containing usually water except orthoperiodic acid and hydrofluoric acid.

Although the dissolution rate of tungsten metal is increased as the treatment temperature by the removing solution of the invention is higher, in the case of too high treatment temperature, the deposition of orthoperiodic acid and the change in the fluid composition by evaporation due to jetting the aqueous solution of high temperature occur, in addition, in the case of too low treatment temperature, temperature is appropriately adjusted because a sufficient removing effect for tungsten metal is not obtained. It is preferably 30-60° C., more preferably 40-50° C.

In addition, as to the removing solution of the invention, various species of additives such as surfactants or aqueous organic solvents may be added within the range of not destroying the removing power.

As a preferable embodiment of the removing solution of the invention, an aqueous solution comprising or consisting of orthoperiodic acid, an aqueous solution comprising or consisting of orthoperiodic acid and hydrofluoric acid, or a constitution, in which small amount of an additive such as surfactant or the like is added to these, can be illustrated.

Except using the removing solution of the invention as a removing solution for unnecessary tungsten metal, which causes a film formation on a semiconductor substrate or adheres to it, it can be used as an etching fluid for a fine patterning (patterning) of a tungsten electrode wiring.

The removing solution of the invention is effective particularly in the case of use for washing a semiconductor substrate in which tungsten metal causes a film formation on an area except a device forming area or adheres to it. For example, it shows a remarkable effect in the case of use for washing and removing tungsten metal which causes a film formation on an area except a device forming area or adheres to it after film formation with tungsten metal on the device forming area of the semiconductor substrate.

Figure 2:
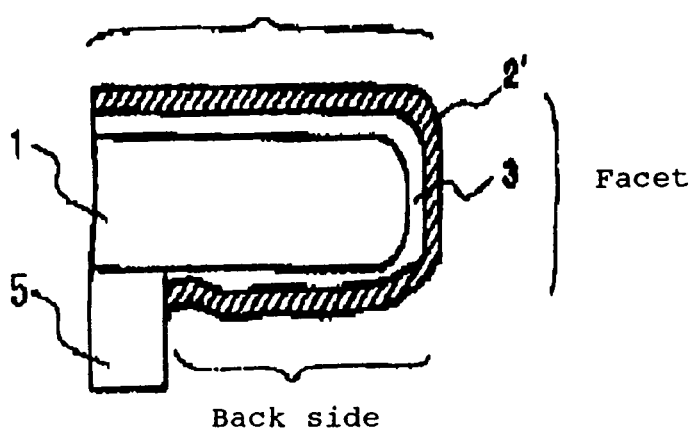
FIG. 2 is a schematic diagram showing the external appearance of the silicon substrate after tungsten film formation.

The treatment to use the removing solution for removing tungsten metal, which causes film formation on the area except the device forming area of the silicon substrate or adheres to it, is explained. FIG. 1 is the figure to show the state of the substrate after tungsten film formation. The silicon substrate 1 is in the state of being loaded on the substrate loading stand 5. In case of forming the tungsten film 2 by CVD method, tungsten causes the film formation on the facet and back side of the silicon substrate 1 or adheres to them. In addition, as shown in FIG. 2, also in case of forming the tungsten film 2' after formation of the insulating film 3 and liner, in the same way use of the removing solution of the invention is effective because the tungsten film causes the film formation on the facet and back side of the silicon substrate or adheres to them.

Figure 3:
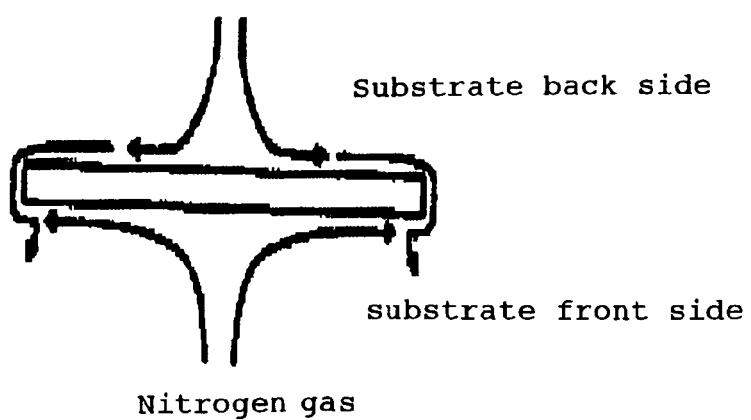
FIG. 3 is a schematic diagram showing removal of tungsten metal using the removing solution in accordance with one or more embodiments of the invention.

When removing of tungsten metal is carried out using the removing solution of the invention, it is desirable to make the removing solution contact to the device forming area. For example, as shown in FIG. 3, it is favorable to make the removing solution contact only to the facet and back side of the silicon substrate, carrying out removing of tungsten metal by a spin washing and blowing inert gases such as nitrogen gas upon the device forming surface.

EXAMPLES

In the following the invention is explained in more detail showing the examples, however, the invention is not limited by these examples.

Example 1

A sample was prepared by cutting out one (film thickness about 500 nm), in which tungsten caused film formation on the silicon substrate, into chips of about 15 mm square. This sample was immersed in the removing solution of the invention at the treatment temperature of about 50° C. The composition of the removing solutions of the invention which were used are shown in Table 1. The content of each component is shown by the value of % by mass against the total removing solution. The remaining is water. The dissolution rate of tungsten metal was calculated from the time which was required till the tungsten metal film disappeared, immersing till disappearance of the tungsten metal film. The results are shown in Tables 1, 2 and 3. The dissolution rate in Tables is nm/min.

From the results shown in Tables 1-3, it is evident that the remarkable removing effect for tungsten metal in orthoperiodic acid or in the combination of orthoperiodic acid and hydrofluoric acid was obtained.

TABLE 1

|  | Orthoperiodic acid (% by mass) | Hydrofluoric acid (% by mass) | Dissolution rate (nm/min) |
| --- | --- | --- | --- |
| No. 1 | 1 | — | — |
| No. 2 | 5 | — | 51 |
| No. 3 | 15 | — | 106 |
| No. 4 | 30 | — | 162 |
| No. 5 | 50 | — | 150 |
| No. 6 | 5 | 0.1 | 75 |
| No. 7 | 5 | 0.5 | 206 |
| No. 8 | 5 | 1 | 211 |
| No. 9 | 15 | 0.1 | 150 |
| No. 10 | 15 | 0.5 | 278 |
| No. 11 | 15 | 1 | 288 |
| No. 12 | 30 | 0.1 | 204 |
| No. 13 | 30 | 0.5 | 337 |
| No. 14 | 30 | 1 | 341 |
| No. 15 | 40 | 0.5 | 339 |

TABLE 2

|  | Orthoperiodic acid (% by mass) | Nitric acid (% by mass) | Hydrochloric acid (% by mass) | Acetic acid (% by mass) | Dissolution rate (nm/min) |
| --- | --- | --- | --- | --- | --- |
| No. 16 | 30 | 5 |  |  | 92 |
| No. 17 | 30 |  | 5 |  | — |
| No. 18 | 30 |  |  | 5 | 117 |

As to No. 17, the evaluation was not carried out due to generation of gas when preparing the removing solution.

TABLE 3

|  | Perchloric acid (% by mass) | Ammonium persulfate (% by mass) | Ammonium cerium (IV) nitrate (% by mass) | Nitric acid (% by mass) | Dissolution rate (nm/min) |
| --- | --- | --- | --- | --- | --- |
| No. 19 | 30 |  |  | 10 | 0 |
| No. 20 |  | 30 |  | 10 | 0 |
| No. 21 |  |  | 30 | 10 | 0 |

Example 2

A sample was prepared by cutting out one (film thickness about 500 nm), in which tungsten caused film formation on the silicon substrate, into chips of about 15 mm square. This sample was immersed in the removing solution of the invention, and for each of stirring the removing solution with stirrer or of not stirring, the dissolution rates at about 30° C., 40° C. and 50° C. was calculated. The composition of the removing solutions which were used is shown in Table 4. The content of each component is shown by the value of % by mass against the total removing solution. The remaining is water. The dissolution rate of tungsten metal was calculated from the time which was required till the tungsten metal film disappeared, immersing till disappearance of the tungsten metal film. The results are shown in Table 4. Further, the unit of the dissolution rate in Table is nm/min.

It was evident that the dissolution of tungsten metal became rapid by stirring. Based on this, comparing with the immersion method, a rapid removing of tungsten metal can be expected in a spin washing in which physical action works.

Table 4 shows the dissolution rates by the immersion method at each temperature of 30° C., 40° C. and 50° C., showing that the dissolution rate is rapid as the temperature is higher, however, since the tungsten removing solution of the invention is jetted to parts except the device forming area of the substrate, in the case that the treatment temperature is too high, the deposition of orthoperiodic acid and the change in the fluid composition by evaporation occur, in addition, in the case that the treatment temperature is too low, a sufficient removing effect for tungsten metal is not obtained, therefore, it is preferably about 30-60° C. more preferably about 40-50° C.

TABLE 4

| | Ortho-periodic acid (% by mass) | Hydro-fluoric acid (% by mass) | Stirring | Temperature/ Dissolution rate (nm/min) | | |
|---|---|---|---|---|---|---|
| | | | | 30° C. | 40° C. | 50° C. |
| No. 1 | 30 | — | No | 29 | 90 | 162 |
| | | | Yes | 30 | 91 | 164 |
| No. 2 | 30 | 0.1 | No | 40 | 108 | 204 |
| | | | Yes | 49 | 126 | 246 |
| No. 3 | 30 | 0.5 | No | 55 | 142 | 337 |
| | | | Yes | 65 | 169 | 380 |
| No. 4 | 30 | 1.0 | No | 55 | 143 | 341 |
| | | | Yes | 65 | 169 | 390 |
| No. 5 | 40 | 0.5 | No | 54 | 140 | 339 |
| | | | Yes | 63 | 167 | 380 |

Example 3

A sample was one, in which silicon oxide or titanium nitride caused film formation on the silicon substrate, and the dissolution rate of titanium nitride and silicon oxide was calculated. The results are shown in Tables 5 and 6. Generally, it is preferable that the etching selection ratio between tungsten metal and the base silicon oxide or titanium nitride is not less than about 10, whereby in the invention, the dissolution rate of silicon oxide or titanium nitride is greatly low compared with that of tungsten metal, and it became evident that the etching ratio was not less than about 10. Based on this, it is evident that the removing solution of the invention has little causticity toward titanium nitride and silicon oxide which are the tungsten liner, and is a very practical removing solution.

TABLE 5

SiO2 etching rate by W removing solution (HF + H5IO6) (Fluid temperature about 50° C. Stirring immersion)

| HF (wt %) | H5IO6 (wt %) | W etching rate (nm/min) | SiO2 etching rate (nm/min) | Etching selection ratio (W rate/SiO2 rate) |
|---|---|---|---|---|
| — | 30 | 164 | 0 | — |
| 0.1 | 30 | 246 | 0.7 | 351 |

TABLE 5-continued

SiO2 etching rate by W removing solution (HF + H5IO6) (Fluid temperature about 50° C. Stirring immersion)

| HF (wt %) | H5IO6 (wt %) | W etching rate (nm/min) | SiO2 etching rate (nm/min) | Etching selection ratio (W rate/SiO2 rate) |
|---|---|---|---|---|
| 0.2 | 30 | 278 | 3 | 93 |
| 0.3 | 30 | 330 | 5 | 66 |
| 0.5 | 30 | 380 | 9 | 42 |
| 1.0 | 30 | 390 | 21 | 19 |

Measurement of SiO2 etching rate by coherence type film thickness meter.

Measurement of SiO2 etching rate by coherence type film thickness meter.

TABLE 6

TiN etching rate by W removing solution (HF + H5IO6) (Fluid temperature 50° C. Stirring immersion)

| HF (wt %) | H5IO6 (wt %) | W etching rate (nm/min) | TiN etching rate (nm/min) | Etching selection ratio (W rate/TiN rate) |
|---|---|---|---|---|
| — | 30 | 164 | 0 | — |
| 0.1 | 30 | 246 | 5↓ | 50↑ |
| 0.2 | 30 | 278 | 5↓ | 50↑ |
| 0.3 | 30 | 330 | 5 | 66 |
| 0.5 | 30 | 380 | 8 | 48 |
| 1.0 | 30 | 390 | 14 | 28 |

Measurement of TiN etching rate by visual inspection

Using the tungsten metal removing solution of the invention, tungsten metal, which causes a film formation on a periphery of the substrate except a device forming area and on other parts or adheres to them, can be dissolved and removed, and it can contribute to improvement in the yield of a semiconductor production.

What is claimed is:

1. A removing solution for removing tungsten metal which causes a film formation on a semiconductor substrate or adheres to it, wherein said removing solution consists of orthoperiodic acid, hydrofluoric acid and water, and the content of orthoperiodic acid is about 5 to 50% by mass and the content of hydrofluoric acid is about 0.1 to 1% by mass, wherein the dissolution rate of tungsten metal from the semiconductor substrate is not less than 200 nm/min.

2. The removing solution according to claim 1, wherein the tungsten metal is tungsten metal which causes a film formation on an area except a device forming area of the semiconductor substrate or adheres to it.

3. A method for removing tungsten metal, which causes a film formation on an area except a device forming area of the semiconductor substrate or adheres to it, by rotating said semiconductor substrate keeping horizontally on which film is formed with tungsten metal and by jetting the removing solution according to claim 1 to an area except the device forming area of said semiconductor substrate.

4. The removing solution of claim 1, wherein the content of orthoperiodic acid is about 5 to 50% by mass and the content of hydrofluoric acid is about 0.5 to 1% by mass.

* * * * *

UNITED STATES PATENT AND TRADEMARK OFFICE
CERTIFICATE OF CORRECTION

PATENT NO.        : 7,351,354 B2                                        Page 1 of 1
APPLICATION NO. : 11/001684
DATED             : April 1, 2008
INVENTOR(S)       : Toshikazu Shimizu et al.

It is certified that error appears in the above-identified patent and that said Letters Patent is hereby corrected as shown below:

Title page, item (73) Assignee:; after

"Kanto Kagaku Kabushiki Kaisha,", delete "Kawasaki, Kanagawa (JP)" and insert -- Tokyo (JP) --.

Title page, item (73) Assignee:; insert

-- NEC Electronics Corporation, Kawasaki, Kanagawa (JP) --.

Signed and Sealed this

Thirtieth Day of December, 2008

JON W. DUDAS
*Director of the United States Patent and Trademark Office*